United States Patent
Chi et al.

(10) Patent No.: US 7,081,395 B2
(45) Date of Patent: *Jul. 25, 2006

(54) SILICON STRAIN ENGINEERING ACCOMPLISHED VIA USE OF SPECIFIC SHALLOW TRENCH ISOLATION FILL MATERIALS

(75) Inventors: Min-Hwa Chi, Hsin-chu (TW); Yee-Chia Yeo, Hsinchu (TW); Chenming Hu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/444,874

(22) Filed: May 23, 2003

(65) Prior Publication Data

US 2004/0232513 A1 Nov. 25, 2004

(51) Int. Cl.
*H01L 21/76* (2006.01)

(52) U.S. Cl. .................. 438/424; 438/435; 438/437

(58) Field of Classification Search ............... 438/424, 438/435, 437

See application file for complete search history.

(56) References Cited

U.S. PATENT DOCUMENTS

| | | | | |
|---|---|---|---|---|
| 5,739,575 A * | 4/1998 | Numano et al. | ............ | 257/513 |
| 5,946,562 A | 8/1999 | Kuo | ............ | 438/166 |
| 6,037,237 A | 3/2000 | Park et al. | ............ | 438/424 |
| 6,297,128 B1 | 10/2001 | Kim et al. | ............ | 438/437 |
| 6,310,367 B1 | 10/2001 | Yagishita et al. | ............ | 257/190 |
| 6,482,715 B1 * | 11/2002 | Park et al. | ............ | 438/424 |
| 6,642,125 B1 * | 11/2003 | Oh et al. | ............ | 438/427 |
| 6,653,200 B1 * | 11/2003 | Olsen | ............ | 438/424 |
| 6,657,276 B1 * | 12/2003 | Karlsson et al. | ............ | 257/510 |
| 6,680,240 B1 * | 1/2004 | Maszara | ............ | 438/455 |
| 6,717,216 B1 * | 4/2004 | Doris et al. | ............ | 257/347 |
| 2004/0063300 A1 * | 4/2004 | Chi | ............ | 438/425 |
| 2004/0212035 A1 * | 10/2004 | Yeo et al. | ............ | 257/510 |

* cited by examiner

*Primary Examiner*—Trung Dang
(74) *Attorney, Agent, or Firm*—Thomas, Kayden, Horstemeyer & Risley

(57) ABSTRACT

A method of forming a strained silicon layer created via a material mis-match with adjacent trench isolation (TI), regions filled with a dielectric layer comprised with either a higher, or lower thermal expansion coefficient than that of silicon, has been developed. Filling of trenches with a dielectric layer comprised with a higher thermal expansion coefficient than that of silicon results in a tensile strain in planar direction and compressive strain in vertical direction, in an adjacent silicon region. Enhanced electron mobility in channel regions of an N channel MOSFET device, and enhanced hole mobility and transit time in an N type base region of a vertical PNP bipolar device, is realized when these elements are formed in the silicon layer under tensile strain. Filling of trenches with a dielectric layer comprised with a lower thermal expansion coefficient than the thermal expansion coefficient of silicon results in a compressive strain in planar directions and tensile strain in vertical directions, in an adjacent silicon region. Enhanced hole mobility in channel regions of an P channel MOSFET device, and enhanced electron mobility and transit time in a P type base region of a vertical NPN bipolar device, is realized when these elements are formed in the silicon layer under compressive strain.

10 Claims, 5 Drawing Sheets

SILICON STRAIN ENGINEERING ACCOMPLISHED VIA USE OF SPECIFIC SHALLOW TRENCH ISOLATION FILL MATERIALS

BACKGROUND OF THE INVENTION (1) Field of the Invention

The present invention relates to methods used to fabricate semiconductor devices, and more specifically to a method used to increase the performance of metal oxide semiconductor field effect transistor (MOSFET), and of vertical bipolar devices, via use of specific trench isolation (TI), fill materials.

(2) Description of Prior Art

Formation of strained, silicon channel regions in MOSFET devices, can enhance carrier transport properties and thus improve device performance for MOSFET devices. Various approaches have been applied in attempts to introduce strain in a MOSFET channel region. Channel regions with the desired strain have been obtained in strained silicon layers, when the silicon layer is grown overlying relaxed semiconductor alloy layers such as silicon-germanium, or silicon-germanium-carbon. However the above approach requires the growth of the semiconductor alloy layer, followed by the epitaxial growth of the strained silicon layer, both adding significant cost and process complexity to the device process sequences used to fabricate MOSFET devices.

This invention will describe methods and layouts, allowing both biaxial compressive strain and tensile strain to be formed in channel regions for MOSFET devices, as well as in base regions of vertical bipolar devices. This is accomplished without the use of semiconductor alloy layers, featuring strain induced in silicon regions located adjacent to STI regions which have been filled with specific materials which allow the desired silicon strain to be realized. Prior art, such as Kim et al, in U.S. Pat. No. 6,297,128 B1, Park et al, in U.S. Pat. No. 6,037,237, Yagishita et al, in U.S. Pat. No. 6,310,367 B1, and Kuo, in U.S. Pat. No. 5,946,562, describe methods of forming: STI regions: some with composite fill layers; some with strained silicon channel regions; and some using the combination of strained channel and STI regions. However none of the above prior art offer the process or layout, described in the present invention in which strained silicon regions are formed as a result of the material used to fill adjacent shallow trench shapes.

SUMMARY OF THE INVENTION

It is an object of this invention to form trench isolation (TI), regions, filled with dielectric layers either comprised with a higher or lower thermal expansion coefficient (low or high $\alpha$), than the thermal expansion coefficient of silicon, to form a strained silicon layer in a portion of a silicon located adjacent to the TI region.

It is another object of this invention to form a channel region for a P type MOSFET device in a compressively strained silicon region, wherein the compressively strained silicon region is induced by adjacent TI regions, filled with a low $\alpha$ dielectric layer.

It is still another object of this invention to form a channel region for an N type MOSFET device in a silicon region under tensile strain, wherein the strained silicon region is induced by adjacent TI regions, filled with a high $\alpha$ dielectric layer.

It is still yet another object of this invention to provide a design in which both N type MOSFET and P type MOSFET devices, each comprised with a strained silicon channel region, can be realized on the same semiconductor chip via a design featuring TI regions with low $\alpha$ dielectric fills, and TI regions with high $\alpha$ dielectric fills.

It is still yet another object of this invention to form vertical bipolar transistor with enhanced performance via a base region under biaxial strain induced by an adjacent TI region, filled with a dielectric layer comprised with either a higher or lower $\alpha$, than silicon.

In accordance with the present invention a method of improving the performance of MOSFET and vertical bipolar devices, via creation of a strained silicon region used as the channel region of the MOSFET device, and used as the base region of the vertical bipolar device, wherein the strained silicon regions is formed via a mis-match to adjacently located TI regions filled with dielectric layer comprised with either a higher or lower $\alpha$, than silicon, has been developed. A first embodiment of this invention entails the formation of TI regions for MOSFET devices wherein the TI region of a P type MOSFET device is comprised with a dielectric layer with a lower $\alpha$ than silicon, creating a compressively strained silicon layer located between TI regions, and wherein the TI region of an N type MOSFET device is comprised with a dielectric layer with a higher $\alpha$ than silicon, creating a silicon layer featuring a tensile strain, located between TI regions. Growth of a gate insulator layer on the strained silicon layer, formation of an overlying gate structure on the gate insulator layer, and formation of source/drain regions in portions of the strained silicon layer not covered by the gate structure, result in a MOSFET device comprised with a channel region formed in the strained silicon layer.

A second embodiment of this invention again entails the formation of TI regions comprised with dielectric fills featuring either a higher $\alpha$, (for vertical PNP devices), or a lower $\alpha$, (for vertical NPN devices), than the thermal expansion coefficient than silicon, wherein a strained silicon region is induced in the portion of semiconductor substrate located between TI regions. A well region, of an opposite conductivity type than that of the semiconductor substrate, is formed in the region of the semiconductor substrate located between the TI regions. A top portion of the well region is than doped to a conductivity type opposite to the conductivity type of the well region, forming a vertical PNP, or vertical NPN bipolar device, in which the base region, or uncompensated well region, is located in the strained silicon region. The enhancement of carriers in the strained silicon, base region results in a performance increase for the vertical bipolar devices when compared to counterpart vertical bipolar devices formed in non-strained silicon regions.

BRIEF DESCRIPTION OF THE DRAWINGS

The object and other advantages of this invention are best described in the attached drawings that include:

FIGS. 4A and 7, which schematically show the layout of a MOSFET device featuring TI regions filled with dielectric layers comprised with either, or with both, a higher or lower $\alpha$, than the thermal expansion coefficient of silicon.

DESCRIPTION OF THE PREFERRED EMBODIMENTS

Figure 1:
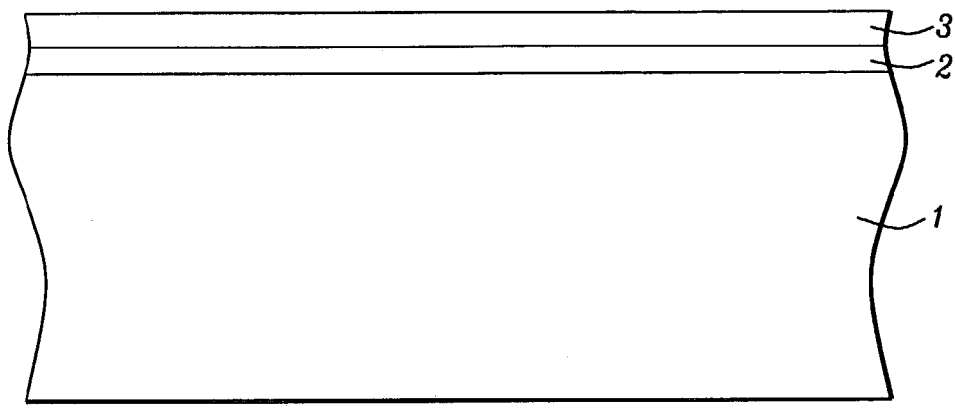
FIGS. 1–3, 4B, 5–10, which schematically, in cross-sectional style, show key fabrication stages used to form a MOSFET featuring a channel region in a strained silicon layer, as well as the key stages used for fabrication of a vertical bipolar device featuring a base region formed in a strained silicon region.

The method of forming MOSFET devices featuring channel regions formed in strained silicon layers, as well as the method of fabricating vertical bipolar devices featuring base regions formed in a strained silicon regions, will now be described in detail. These methods based on current 0.13 um CMOS generation technology can be extended to future 90 nm generation and beyond. A first embodiment of this invention is directed at the fabrication of MOSFET devices in which the channel region of both P channel, (PMOS), and N channel (NMOS), devices are located in strained silicon layers, which in turn are formed via a material mis-match between silicon and the dielectric material used to fill adjacently located TI regions. A P type semiconductor substrate 1, comprised of single crystalline silicon featuring a <100> crystallographic orientation, is used and schematically shown in FIG. 1. Silicon oxide layer 2, to be used as a pad oxide layer, is typically grown via thermal oxidation procedures to a thickness between about 80 to 150 Angstroms. Silicon nitride layer 3, is next deposited via low pressure chemical vapor deposition (LPCVD), or plasma enhanced chemical vapor deposition (PECVD), procedures, to a thickness between about 800 to 1500 Angstroms. This is schematically shown in FIG. 1.

Figure 2:
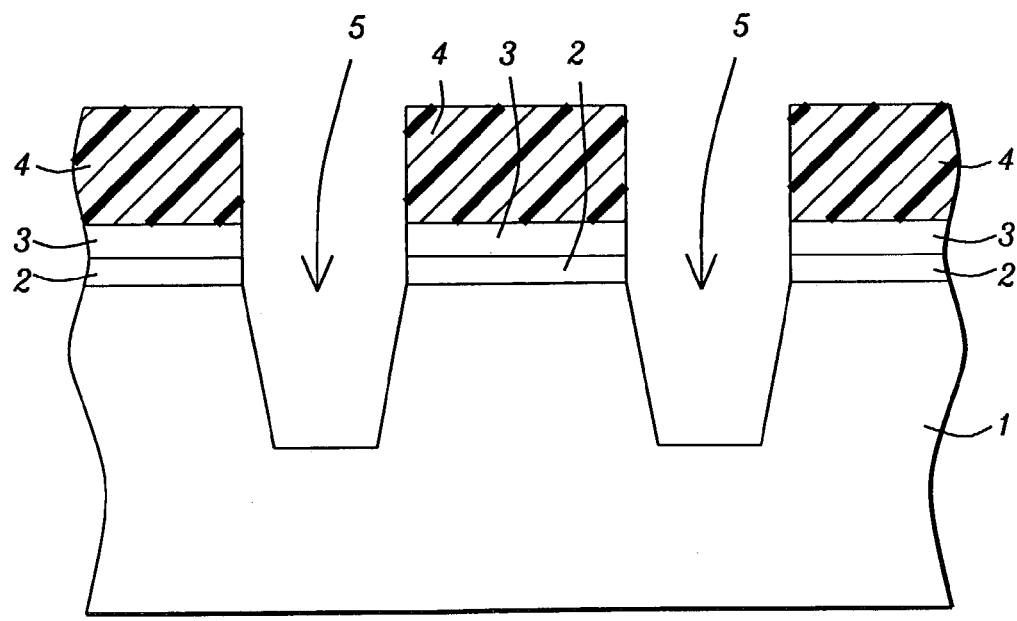

Photoresist shape 4, is formed and used as an etch mask to allow a reactive ion etch (RIE), procedure to define an opening in silicon nitride layer 3, and in silicon oxide layer 2, and to define shallow trench shapes 5, in a top portion of semiconductor substrate 1. The RIE procedure used to etch silicon nitride, silicon oxide, and silicon is well known to those familiar with CMOS fabrication technology. The depth of shallow trench shapes in semiconductor substrate 1, is between about 2500 to 5000 Angstroms, while the minimum width of the shallow trench shapes is about 1500 Angstroms, as limited by current lithography tools in 0.13 um technology. The RIE procedure is performed with an isotropic etch component resulting in vertical shallow trench shapes 5, being defined with slightly tapered sides, which allow optimized filling of these shapes to be subsequently realized. Shallow trench shapes 5, are defined with no lateral undercut underneath the pad silicon oxide and silicon nitride stack. The result of these procedures is schematically shown in FIG. 2.

Figure 3:
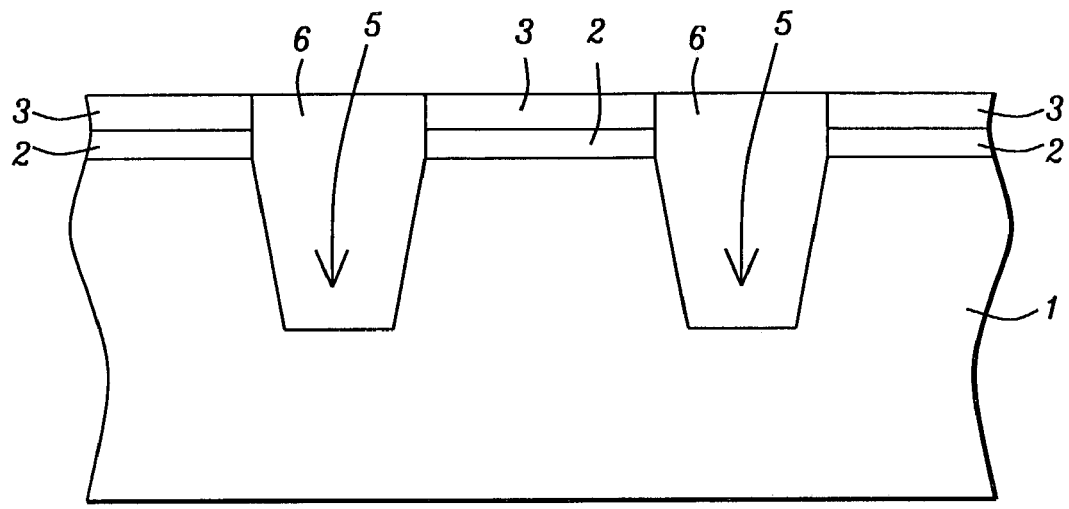

After removal of photoresist shape 4, via plasma oxygen ashing procedures, a thin silicon dioxide liner layer (not shown in the drawings), is thermally grown on the exposed surfaces of shallow trench shapes 5. A dielectric layer with a specific thermal expansion coefficient ($\alpha$), is next deposited completely filling shallow trench shapes 5. To obtain the material mis-match between the shallow trench filling dielectric layer and the adjacent silicon region, a dielectric layer with either a higher or lower $\alpha$, than the counterpart silicon $\alpha$, is chosen. For the first example an NMOS device shown schematically in FIG. 3, the dielectric layer chosen to fill shallow trench shapes 5, is comprised with a higher $\alpha$, than silicon where silicon features a thermal expansion coefficient of about $2E$-$6°$ $K.^{-1}$. Dielectric layer 6, fulfilling this criteria is chosen from a group containing the following: zirconium oxide, steatite ($MgOSiO_2$), aluminum oxide, aluminum nitride, silicon carbon, and silicon nitride, all exhibiting high thermal expansion coefficients (high $\alpha$), between about $3E$-$6$ to $11E$-$6°$ $K.^{-1}$. High $\alpha$ layer 6, is obtained via chemical vapor deposition (CVD), procedures, at a thickness between about 6000 to 8500 Angstroms, completely filling shallow trench shapes 5. A chemical mechanical polishing (CMP), procedure is next employed removing portions of high $\alpha$ layer 6, from the top surface of silicon nitride layer 3, resulting in the desired TI region filled with high $\alpha$ layer 6. Note that the silicon nitride layer serves as a CMP stop layer and is also removed slightly during a CMP over-polish step. The silicon region located between these TI regions will now be under tensile stress and therefore tensile strained due to the mis-match in the thermal expansion coefficients of these materials, with a subsequent MOSFET channel region located in the tensile strained silicon layer, exhibiting enhanced carrier mobility and thus enhanced performance, when compared to counterpart N channel MOSFET devices formed in non-strained silicon regions.

Figure 4A:
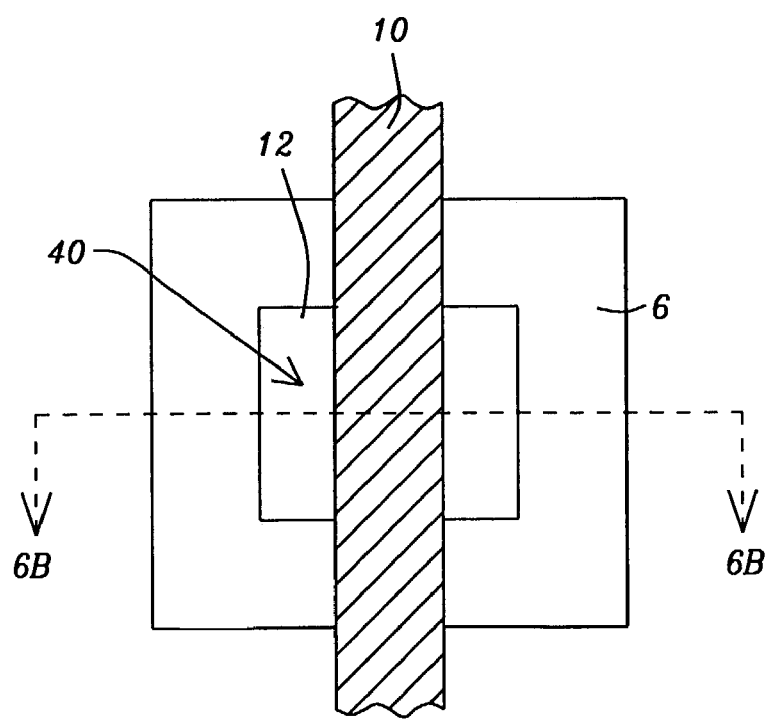
Figure 4B:
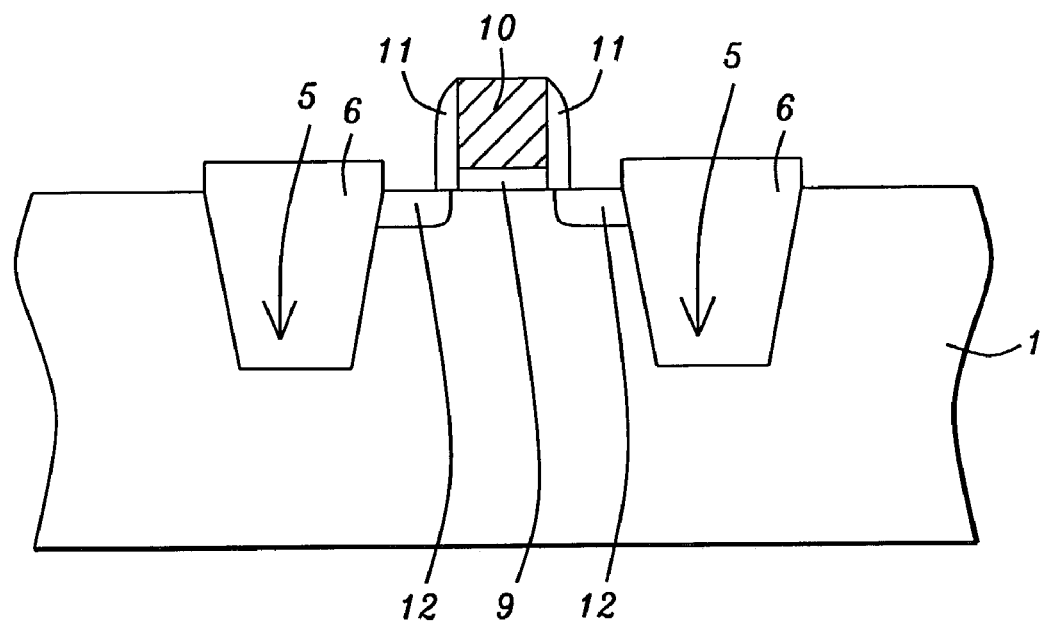

The fabrication of the N channel MOSFET device, featuring enhanced carrier mobility in a strained silicon channel region obtained via use of TI regions filled with dielectric materials having thermal expansion coefficients higher than silicon, is next addressed and schematically shown in cross-sectional style in FIG. 4B. Removal of silicon nitride layer 3, is typically accomplished via a selective hot phosphorous acid solution, followed by the removal of silicon oxide layer 2, via use of a buffered hydrofluoric (BHF) solution. Silicon dioxide gate insulator layer 9, is next thermally grown to a thickness between about 17 to 25 Angstroms, in an oxygen-steam ambient. Conductive gate structure 10, comprised of a conductive material such as doped polysilicon, is next defined on silicon dioxide gate insulator 9. This is accomplished via deposition of a polysilicon layer, via LPCVD procedures at a thickness between about 1000 to 2000 Angstroms, with the polysilicon layer either doped in situ during deposition via the addition of arsine or phosphine, or the polysilicon layer deposited intrinsically than doped via implantation of arsenic or phosphorous ions. Photolithographic and RIE procedures, using $Cl_2$ chemistry as etchant for polysilicon, are then employed to define conductive gate structure 10. Insulator spacers 11, comprised of either silicon nitride or silicon oxide, are next formed on the sides of conductive gate structure 10. This is accomplished via deposition of the insulator layer via LPCVD or PECVD procedures, to a thickness between about 600 to 1200 Angstroms, followed by an anisotropic RIE procedure performed using either $Cl_2$ chemistry or $CHF_3$ chemistry as an etchant. Finally heavily doped source/drain region 12, is formed via implantation of arsenic or phosphorous ions into portions of semiconductor substrate 1, not covered by conductive gate structure 10, or by insulator spacers 11. This is schematically shown in FIG. 4B. A top view, shown schematically in FIG. 4A, shows active device region 40, bounded by STI region 6, comprised with high a layer 6, therefore resulting in strained silicon in active device region 40. The channel region, located underlying conductive gate structure 10, in active device region 40, is located in a tensiley strained silicon layer, with the tensile strain allowing mobility enhancement of N type carriers, or electrons to be realized, thus increasing the performance of the NMOS device.

To increase the performance of PMOS device, the strain in the channel region should be a compressive strain. This again is accomplished via a mis-match between silicon and surrounding TI regions, however to induce compressive strain in silicon the dielectric layer used to fill the TI regions needs to be comprised with a thermal expansion coefficient less than the thermal expansion coefficient of silicon. Therefore a material such as silicon oxide, featuring a low $\alpha$, of about $5E$-$7$ $K^{-1}$, compared to the thermal coefficient of silicon, $2E$-$6$ $K^{-1}$, is used to fill the shallow trench shapes. A CMP procedure is used to remove unwanted portions of the low α layer from the top surface of silicon nitride layer 3. For fabrication of a PMOS device in a P type semiconductor substrate, an N well region is formed between TI regions, in a top portion of the semiconductor substrate. Gate insulator growth, conductive gate structure formation, and formation of insulator spacers, are again performed using identical procedures used for fabrication of the NMOS device. However for the PMOS device boron ions are implanted into top portions of the N well region to form a P type heavily doped source/drain region. The channel region, located underlying a conductive gate structure in active device region, is located in a compressively strained silicon layer, with the compressive strain allowing mobility enhancement of P type carriers, or holes to be realized, thus increasing the performance of the PMOS device.

Figure 5:
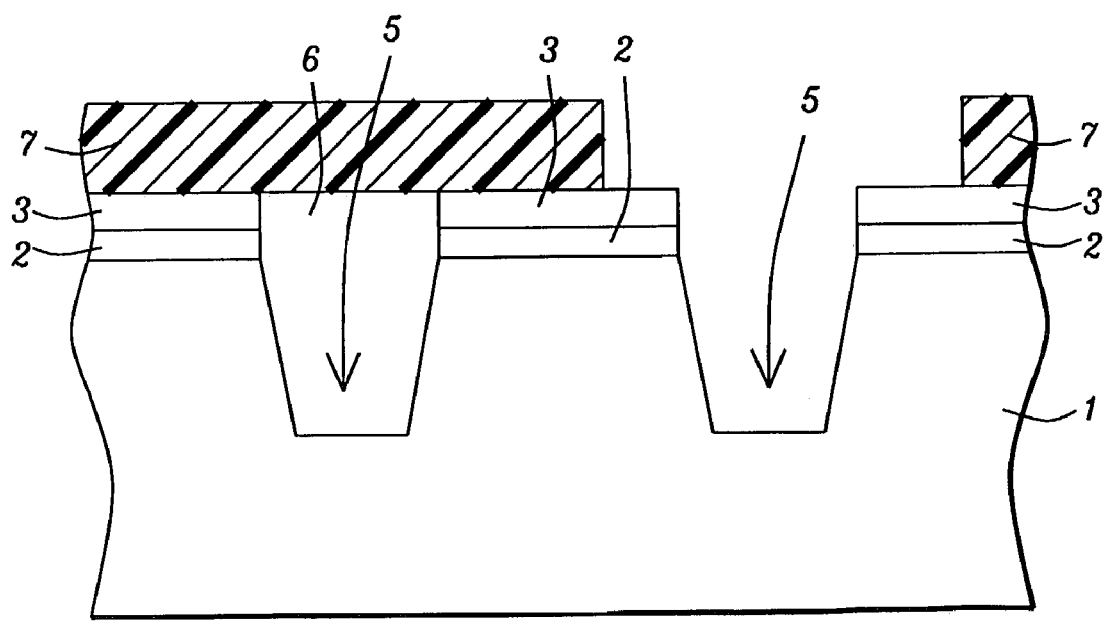
Figure 6:
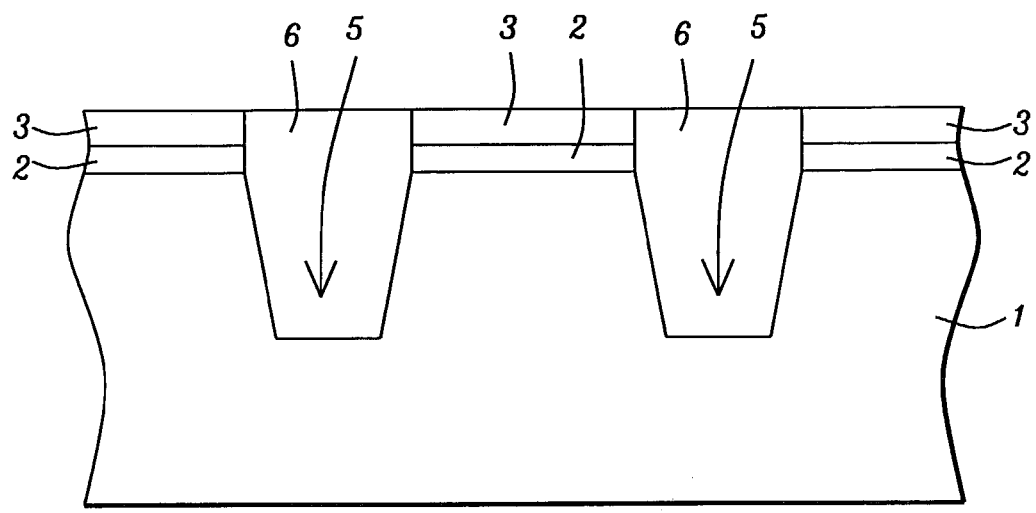
Figure 7:
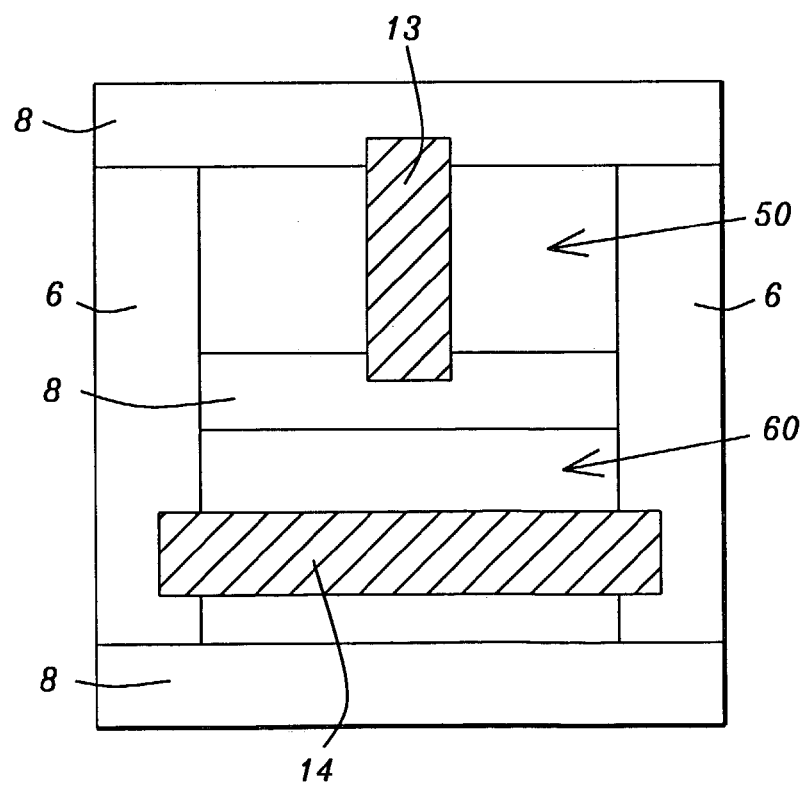

The ability to form both NMOS and PMOS devices on the same semiconductor chip, each featuring enhanced performance as a result of channel regions located in strained silicon regions, is next addresses and illustrated using FIGS. 5–7. Referring to FIG. 5, after filling TI regions 5, with high α layer 6, photoresist shape 7, is formed and used as an etch mask allowing high α layer 6, to be selectively removed from specific TI shapes. The removal of high α layer 6, is selectively accomplished via use of plasma etching or by wet etching methods. Low α layer 8, a layer such as silicon oxide, is next deposited via LPCVD or PECVD procedures, refilling the empty shallow trench shape. CMP procedures are then employed for planarization purposes, removing portions of low α layer 8, from the top surface of silicon nitride layer 3, as well as from the top surface of TI region 5, filled with high α layer 6. This is schematically shown in FIG. 6.

Completion of the NMOS and PMOS devices is next accomplished via: formation of an N well region in a portion of the semiconductor substrate reserved for the PMOS device; removal of masking silicon nitride layer 3, pad silicon oxide layer 2; growth of a gate insulator layer; formation of conductive gate structures; formation of insulator spacers on the sides of the conductive gate structure; and formation of heavily doped N type source/drain region in an NMOS section and of a heavily doped P type source/drain region in the PMOS section of the semiconductor substrate. FIG. 7 schematically shows a top view of the NMOS device comprised with active device region 50, and of the PMOS device comprised with active device region 60. The asymmetrical strain exhibited by the TI regions allow a tensile strain to be realized in NMOS active device region 50, featuring a channel region under tensile strain in the same direction of electron flow when the NMOS is turned on, underlying the conductive gate structure 13. Note that the electron mobility is enhanced namely by the tensile strain in the same direction of electron flow in NMOS. The strain in other directions perpendicular to the electron flow has negligible effect. The tensile strain in active device region 50, was obtained as a result of the TI regions filled with high α layer 6, located parallel in direction to gate structure 13. In addition the asymmetrical strain exhibited by the TI regions filled with low α layer 8, allowed a compressive strain, in the same direction as the hole flow when the PMOS is turned on, to be realized in PMOS active device region 60. Thus the PMOS channel region now comprised with compressive strain along the direction of hole flow, located underlying conductive gate structure 14, allows the attainment of increased hole mobility to be realized. Note that the hole mobility is enhanced mainly by the compressive strain in the same direction of hole flow in PMOS. The strain in other directions perpendicular to the hole flow has negligible effect. In addition note that with the arrangement of TI filling material shown in FIG. 7, there is compressive strain in a direction perpendicular to the tensile strain direction in NMOS active region 50, and similarly in the PMOS active area 60. Thus the orientation of NMOS and PMOS needs to be properly matched by the arrangement of TI regions filled with low or high α to take advantage of mobility enhancement.

As shown in FIG. 7, PMOS active region 60 and NMOS active region 50 are rectangular. Each of PMOS active region 60 and NMOS active region 50 is surrounded or abutted by TI regions filled with either low α layer 8 or high α layer 6. The TI regions with low α layer 8 are substantially positioned in a direction perpendicular to the TI regions with high α layer 6. As a result, two TI regions with low α layer 8 abuts a pair of boundaries of an active region while two TI regions with high α layer 6 abuts the other pair of boundaries of the active region. As a result, the TI regions with low α layer 8 create compressive strain along a vertical direction on the surface of the PMOS and NMOS active regions 60 and 50 while the TI regions with high α layer 6 create tensile strain along a horizontal direction. As shown in FIG. 7, the channel region of the NMOS can conduct horizontal electron flow and the channel region of the PMOS can conduct vertical hole flow. The gate of the NMOS is perpendicular to the gate of the PMOS, as shown in FIG. 7.

Figure 8:
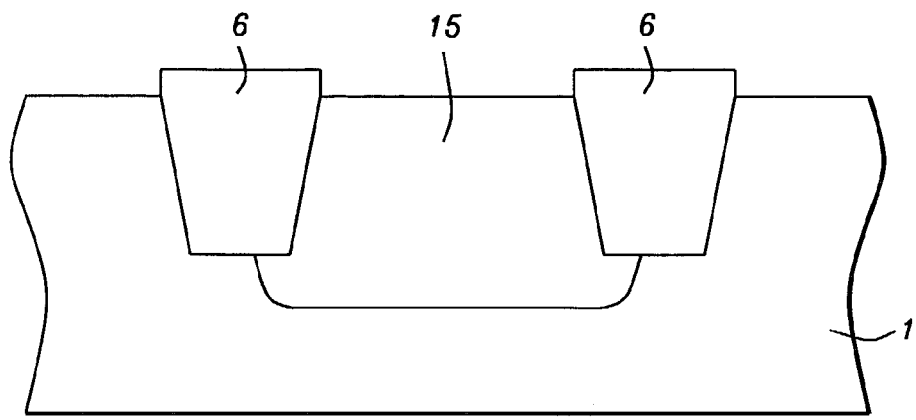

Similar performance enhancement realized for MOSFET devices via strain induced in regions of silicon located between TI regions filled with either high or low α dielectric materials, can be applied to enhance the performance of parasitic vertical bipolar devices which are simultaneously fabricated with the MOSFET devices. FIG. 8, schematically show TI regions 6, filled with a dielectric layer featuring a thermal expansion coefficient greater than the thermal expansion coefficient of silicon. This again results in the portion of silicon located between TI regions 6, to be under tensile strain. N well region 15, the same N well region used for fabrication of the PMOS devices, is formed in a top portion of P type semiconductor substrate 1, via implantation of arsenic or phosphorous ions. N well region, located between TI regions 6, is under tensile strain.

Figure 9:
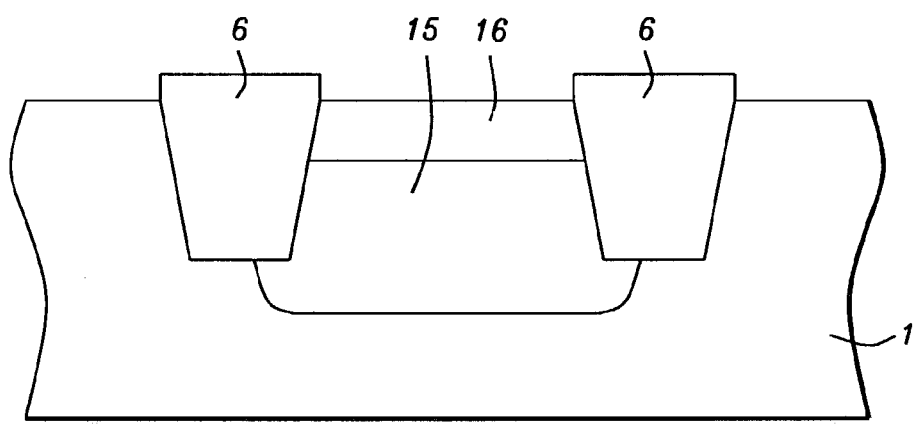

Heavily P type region 16, is next formed in a top portion of N well region 15, formed simultaneously during the procedure used to form a heavily doped P type, source/drain region 16, for the PMOS device. The vertical PNP bipolar device is now comprised of heavily doped P type region 16, functioning as the emitter of the vertical PNP device, N well region 15, functioning as the base region of the vertical PNP bipolar device, and P type semiconductor substrate 1, functioning as the collector region of the vertical PNP bipolar device. This is schematically shown in FIG. 9. Since base region or N well region 15, is under tensile strain along surface direction, but compressive strain in vertical direction, hole mobility is increased as holes are injected from emitter 16, vertically towards the base region 15, and collector 1. This phenomena allows hole mobility to be increased when compared to counterpart base regions formed in non-strained regions, thus enhancing the performance of the vertical PNP bipolar device, formed between TI regions 6. Note that the holes move from emitter towards base and collector in the vertical PNP bipolar, thus compressive strain along vertical direction can enhance the hole mobility and transit time through the base, and in turn the performance of the vertical PNP bipolar device.

Figure 10:
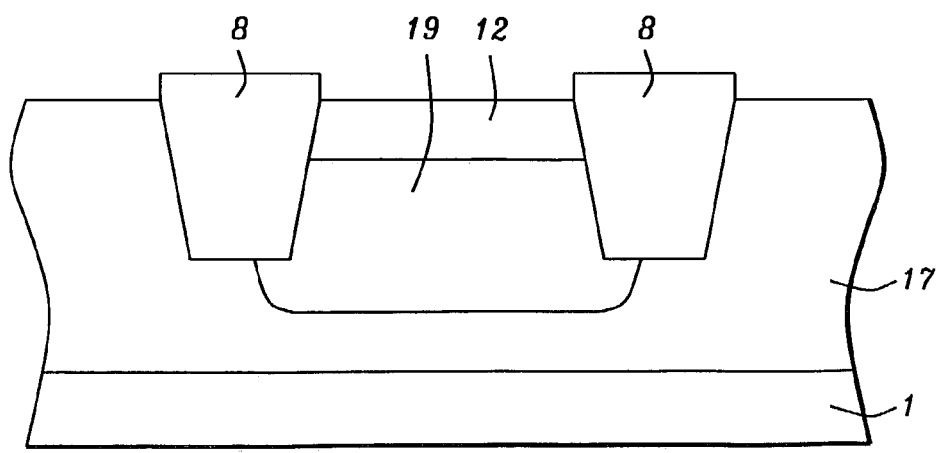

The formation of a parasitic vertical NPN bipolar device, formed simultaneously during MOSFET fabrication procedures, is next illustrated in FIG. 10. Prior to formation of STI regions 8, deep N well region 17, is first formed in a top portion of semiconductor substrate 1, via high energy implantation of arsenic or phosphorous ions. TI regions 8, again filled with a dielectric layer comprised with a thermal expansion coefficient less than the thermal coefficient of silicon, are next formed in a top portion of deep N well region 17. P well region 19, is next formed in a top portion of deep N well region 17, located in a portion of silicon, with P well region 19, experiencing compressive strain as a result of adjacent TI regions 8. Finally heavily doped N region 12, is formed in a top portion of P well region 19, during the same implantation procedure used to form the heavily doped N type, source/drain region 12, for the NMOS device. The resulting vertical NPN bipolar device is comprised of heavily doped N type region 12, functioning as the emitter of the vertical NPN device, P well region 19, functioning as the base region of the vertical NPN bipolar device, and deep N well region 17, functioning as the collector region of the vertical NPN bipolar device. This is schematically shown in FIG. 10. Since the base region or uncompensated portion of P well region 19, is under compressive strain, mobility is increased as electrons injected from emitter 12, vertically downward to base 19, and collector 17. The mobility is now increased when compared to counterpart base regions formed in non-strained regions, thus enhancing the performance of the vertical NPN bipolar device, formed between STI regions 8. Note that the electrons move from emitter toward the base and collector in the vertical NPN bipolar, thus the tensile strain along the vertical direction can enhance the electron mobility and transit time through the base, thus inturn increase the performance of the vertical NPN device.

While this invention has been particularly shown and described with reference to the preferred embodiments thereof, it will be understood by those skilled in the art that various changes in form and details may be made without departing from the spirit and scope of this invention.

What is claimed is:

1. A method of forming trench isolation (TI) regions in a semiconductor substrate to create strained regions, comprising:
   defining first trenches and second trenches in the semiconductor substrate to surround active regions;
   filling the first trenches with a first dielectric layer and the second trenches with a second dielectric layer to form said TI regions, wherein a first active region among the active regions abuts one of the first trenches and one of the second trenches, wherein the active regions have a thermal expansion coefficient less than the thermal expansion coefficient of the first dielectric layer and greater than the thermal expansion coefficient of the second dielectric layer; and
   forming a semiconductor device in the active regions.

2. The method as claimed in claim 1, wherein the step of filling the first trenches with the first dielectric layer and the second trenches with the second dielectric layer comprises:
   filling the first trenches and the second trenches with the first dielectric layer;
   removing the first dielectric layer in the second trenches; and
   filling the second trenches with the second dielectric layer.

3. The method as claimed in claim 1, wherein the first trenches create compressive strain along a first direction on a surface of the first active region, the second trenches create tensile strain along a second direction on the surface of the first active regions, and the first direction is perpendicular to the second direction.

4. The method as claimed in claim 3, wherein forming the semiconductor device in the active regions comprises:
   forming a NMOS in the first active region, the NMOS having a channel region to conduct carrier substantially along the first direction.

5. The method as claimed in claim 3, wherein forming the semiconductor device in the active regions comprises;
   forming a PMOS in the first active region, the PMOS having a channel region to conduct carrier substantially along the second direction.

6. The method as claimed in claim 3, wherein a second active region among the active regions abuts one of the first trenches and one of the second trenches;
   the first trenches create compressive strain along a third direction on a surface of the second active region;
   the second trenches create tensile strain along a fourth direction on the surface of the second active region;
   the third direction is perpendicular to the fourth direction; and
   the first direction is parallel to the third direction.

7. The method as claimed in claim 6, wherein forming a semiconductor device in the active regions comprises:
   forming a NMOS in the first active region, the NMOS having a channel region to conduct carrier substantially along the first direction; and
   forming a PMOS in the second active region, the PMOS having a channel region to conduct carrier substantially along the fourth direction.

8. The method as claimed in claim 1, wherein the first active region has a rectangular surface with two pairs of straight boundaries, two of the first trenches abut one pair of the straight boundaries, and two of the second trenches abut the other pair of the straight boundaries.

9. A method of forming trench isolation (TI) regions in a semiconductor substrate to create strained regions, comprising:
   defining first and second trenches in the semiconductor substrate to surround active regions;
   filling the first trenches with a first dielectric layer and the second trenches with a second dielectric layer to form said TI regions, wherein the active regions have a thermal expansion coefficient less than the thermal expansion coefficient of the first dielectric layer and greater than the thermal expansion coefficient of the second dielectric layer, and the first trenches and the second trenches are disposed in substantially perpendicular relation to each other; and
   forming a semiconductor device in the active regions.

10. The method as claimed in claim 9, wherein forming a semiconductor device in the active regions comprises:
    forming a NMOS in a first active region and a PMOS in a second active region;
    wherein a gate of the NMOS is substantially perpendicular to a gate of the PMOS.

* * * * *